United States Patent
Sung et al.

(10) Patent No.: US 6,214,662 B1
(45) Date of Patent: Apr. 10, 2001

(54) FORMING SELF-ALIGN SOURCE LINE FOR MEMORY ARRAY

(75) Inventors: Hung-Cheng Sung, Hsin-Chu; Di-Son Kuo, Hsinchu; Chia-Ta Hsieh, Tainan; Yai-Fen Lin, Non-Tour, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/609,165

(22) Filed: Jul. 3, 2000

(51) Int. Cl.$^7$ ............................................. H01L 21/8242
(52) U.S. Cl. .......................... 438/241; 438/305; 438/639
(58) Field of Search .................................. 438/210, 241, 438/253, 305, 396, 595, 596, 639

(56) References Cited

U.S. PATENT DOCUMENTS

| | | | |
|---|---|---|---|
| 5,275,972 | * 1/1994 | Ogawa et al. | 438/639 |
| 5,466,637 | * 11/1995 | Kim | 438/639 |
| 5,480,814 | * 1/1996 | Wuu et al. | 438/305 |
| 5,589,413 | 12/1996 | Sung et al. | 437/43 |
| 5,710,073 | 1/1998 | Jeng et al. | 438/239 |
| 5,817,562 | 10/1998 | Chang et al. | 438/305 |
| 5,863,820 | 1/1999 | Huang | 438/241 |

* cited by examiner

*Primary Examiner*—Chandra Chaudhari
(74) *Attorney, Agent, or Firm*—George O. Saile; Stephen B. Ackerman; Sevgin Oktay

(57) ABSTRACT

A method is provided for forming a source line self-aligned to adjacent transistor device. This is accomplished by a forming a self-aligned polysilicon as a source line in an opening formed in a doped polysilicon layer separated from the source line by a spacer. The alignment of the poly source line with the transistor is provided by employing still another thin polysilicon layer as a mask for etching the source opening in the doped polysilicon layer which already has an outside wall aligned with respect to the contact hole for the drain of the device. An additional spacer is provided between the outside wall of the doped poly and the drain contact.

56 Claims, 5 Drawing Sheets

FIG. 1a – Prior Art

FORMING SELF-ALIGN SOURCE LINE FOR MEMORY ARRAY

BACKGROUND OF THE INVENTION (1) Field of the Invention

The present invention relates to the manufacture of integrated circuits in general, and more particularly to a method of forming a self-aligned poly as a source line in a memory array.

(2) Description of the Related Art

Self-alignment techniques are important in VLSI and ULSI (very large and ultra large scaled integrated) fabrication technology since they reduce the difficulties of precise alignment, and allow considerable shrinkage of the device size. A measure of the degree of shrinkage in each new generation of technology is the minimum gate length, for example, in MOS (metal-oxide-semiconductor) devices. At the same time, it is known that in order to assure proper MOS device operation, it is essential to have an overlap between the gate and the source/drain electrodes of the device in mask alignment during device fabrication. The overlap, on the other hand, is governed by the gate length. Thus, source and drain regions might not line up correctly relative to the gate, deposited contacts might not line up perfectly inside contact holes. It is disclosed later in the embodiments of the present invention a method of forming a self-aligned source to an adjacent transistor and a self-aligned contact.

In prior art, a variety of techniques have been introduced to overcome these problems. In U.S. Pat. No. 5,710,073, Jeng, et al., use a configuration of spacers and etch barriers to form self aligned source and drain contacts. Antireflective silicon nitride cap layers and highly selective etches are used to define smaller interconnect openings. First spacers are formed on the gate electrodes. Later, the second spacers are formed in insulation layers over the gate electrodes. The self-aligning process, which uses the two set of spacers, allows a wide processing window for contact etching to form the contact hole and permit a small contact aspect ratio. The method reduces the masking steps by defining both the source and drain contacts in the same masking step.

A different method of manufacturing self-aligned bit-line is proposed by Sung, et al., in U.S. Pat. No. 5,589,413 where an electrically programmable read only memory device is provided with self-aligned bit-lines in a semiconductor substrate. A tunnel oxide layer is formed on the substrate. Blanket layers of doped, polysilicon layer, an interelectrode dielectric layer and a blanket polycide layer are formed over the dielectric layer. Another dielectric layer is formed over the blanket polycide layer and a silicon nitride layer. A self-aligned source and drain etching process forms gate electrode stacks with trench spaces between the stacks in an array. Spacer dielectric structures are formed adjacent to the sidewalls over the drain regions leaving narrow drain spaces therebetween and spacer dielectric plugs completely filing the spaces over the source regions. A blanket dielectric layer is formed over the stacks, spaces and sidewalls. Drain bit-line openings are etched to the drain regions through the blanket dielectric layer and the tunnel oxide layer over the drain regions between the spacers. A barrier metal layer is formed over the drain regions. A conductive metal layer in contact with the drain regions through the bit-line openings is etched to form the metal layer leaving the bit-lines across the device and contacting with the drain regions.

Chang, et al., in U.S. Pat. No. 5,817,562 teach a method for making more reliable self-aligned contacts (SAC) with improved sidewall profiles. The method uses a stacked gate electrode layer having a TEOS oxide and a hard mask of silicon nitride on the gate electrode polysilicon layer. During patterning of the stacked gate electrode structure using a photoresist mask, the hard mask minimizes the buildup of a polymer on the TEOS oxide sidewall. This results in improved gate electrode line length tolerance and much improved sidewall spacers that minimize electrical shorts between the metal source/drain contact and the polysilicon gate electrodes.

Huang of U.S. Pat. No. 5,863,820 proposes integrating the self-aligned contact process with salicide process on a chip wherein logic and memory share the same chip. Contacts to the memory circuits are made using the SAC process, thus ensuring maximum density, while the logic circuits are made using SALICIDE process, thus ensuring high performance. The two process are integrated within a single chip by first forming polysilicon gate pedestals, those located in the memory areas also having hard masks of silicon nitride. Next, spacers are grown on the vertical sides of the pedestals. Source/drain regions are formed, and then the pedestals on the memory side are given a protective coating of oxide. This allows SALICIDE processes to be selectively applied to only the logic side. Then, while the logic side is protected, the SAC process is applied to the memory side.

In the prior art cited above, the source line that runs continuously between memory cells in an array within the substrate must have sufficient contact size which in turn must have proper spacing to the poly lines for shorts not to occur. This is shown in a top view of substrate (10) in FIG. 1a, where field oxide regions (20) are formed defining source regions (30). Buried source line (50) runs across the source regions in the memory array. The word lines (40) are formed over the substrate and are separated by width $w1 = 2 \times d1 + d2$, where d1 is the distance from the field oxide to the source line, and d2 is the width of the source line. This is to be compared with the proposed structure shown in FIG. 1b, where poly line (60) of width $w2 = d3$ forms the source line connecting source regions (20) which are isolated from one another by isolation regions (20). It will be disclosed later in the embodiments of the instant invention that the poly source line is formed with a narrow spacer (65) with an oxide cap over the floating gate such that separation of d1 is no longer needed. It will be apparent to those skilled in the art that the isolation regions can be continuous without providing the d1 distance required, and, therefore, width $w2 = d3$ can be made much smaller than $w1 = 2 \times d1 + d2$. Thus, the disclosed method of forming source line provides a much smaller cell size.

SUMMARY OF THE INVENTION

It is therefore an object of this invention to provide a method of forming a source line self-aligned to an adjacent transistor device by a judicious use of polysilicon deposition and etching process.

It is another object of this invention to provide a method of forming a self-aligned poly as a source line in a memory array.

It is yet another object of this invention to provide a method of forming a self-aligned contact.

These objects are accomplished by providing a semiconductor substrate; forming active and passive regions in said substrate; forming a gate oxide layer over said substrate; forming a first doped polysilicon layer over said gate oxide layer; forming a nitride layer over said first polysilicon layer; forming a first photoresist mask having a floating gate pattern over said gate oxide layer; etching said nitride layer through said floating gate pattern in said photoresist mask; removing said first photoresist mask; forming an oxide layer over said substrate; planarizing said oxide layer; forming a second polysilicon layer over said substrate; patterning said second polysilicon layer to define a self-aligned source region; wet etching said nitride layer underlying said second polysilicon layer through said patterning in said second polysilicon layer; forming an opening in said first polysilicon layer using said oxide layer and remaining said nitride layer as a hard mask; performing source implantation through said opening in said first polysilicon layer; forming a spacer in said opening in said first polysilicon layer; forming a third polysilicon layer in said opening in said first polysilicon layer; planarizing said third polysilicon layer; forming a poly-oxide layer over said third polysilicon layer in said opening in said first polysilicon layer; removing said nitride layer to expose an oxide wall of adjacent said oxide layer by using said oxide layer and remaining nitride layer as a hard mask; etching said first polysilicon layer to expose a polysilicon wall underlying said oxide wall; forming a spacer along said oxide wall and said polysilicon wall; performing drain implantation in said substrate; and forming contacts for said drain regions of said memory cell.

BRIEF DESCRIPTION OF THE DRAWINGS

FIG. 1a is a partial top view of a semiconductor substrate showing the relative width of a conventional source line.

DESCRIPTION OF THE PREFERRED EMBODIMENTS

Figure 1B:
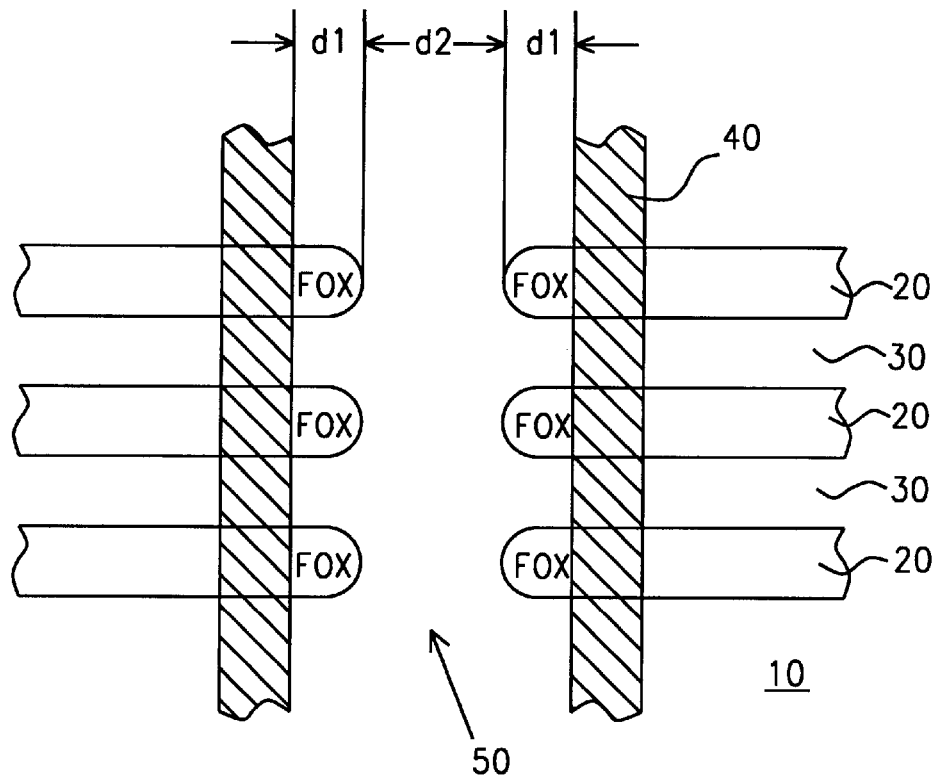
FIG. 1b is a partial top view of a semiconductor substrate showing the relative width of a self-aligned poly source line of this invention.
Figure 1B:
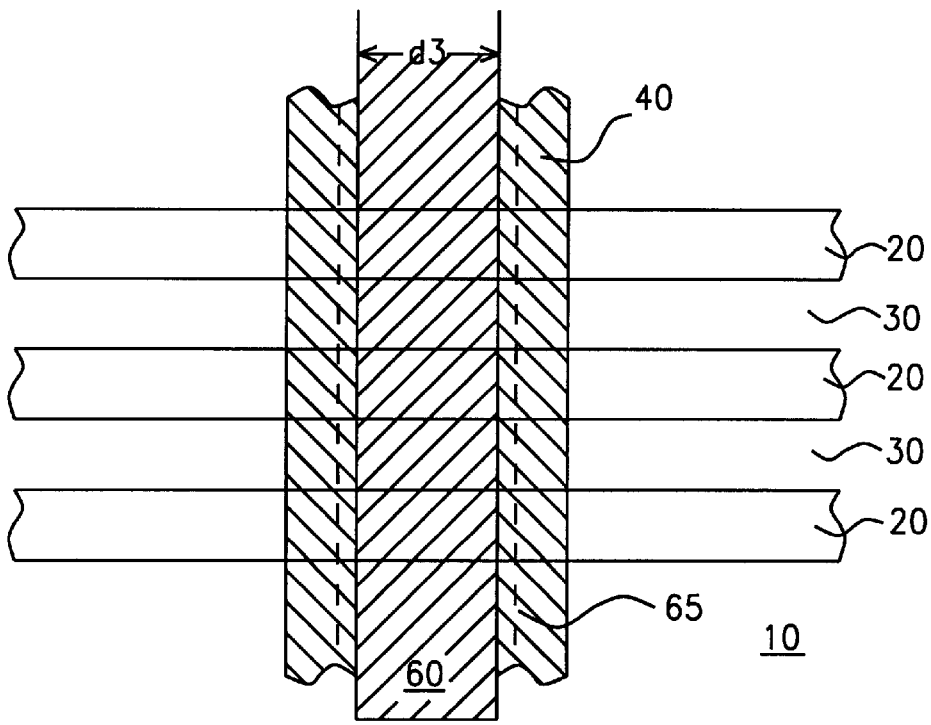

Referring now to the drawings, in particular to FIGS. 2a–2l, there are shown schematically steps of forming a source line self-aligned to an adjacent transistor device. Source-line itself is polysilicon formed in a doped polysilicon layer with aligned spacers therein. The source line is also self-aligned with respect to the drain contacts of the memory device.

Figure 2A:
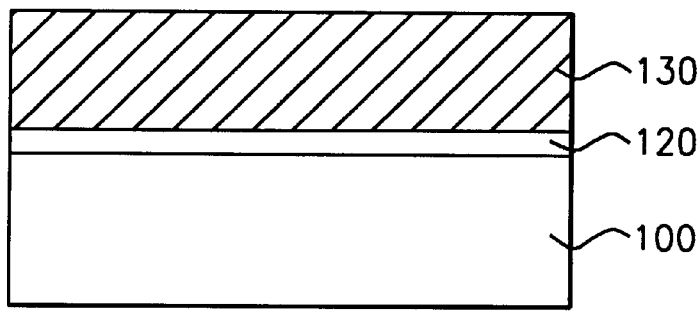
FIG. 2a is a partial cross-sectional view of a semiconductor substrate showing the forming of a gate oxide and doped polysilicon layer, according to the present invention.

More specifically, FIG. 2a shows a partial cross-section of a semiconductor substrate, (100), preferably silicon. Gate oxide layer (120) is formed on the substrate by a thermal oxidation process at a temperature between about 850 to 1100° C. Alternatively, the oxide can be formed by an atmospheric or low pressure chemical vapor deposition process as is well known. The preferred thickness of gate oxide layer is between about 50 to 100 Å.

Subsequently, first polysilicon layer (130) is formed over the gate oxide layer through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 500 to 650° C. The preferred thickness is between about 1000 to 2000 angstroms (Å). The first polysilicon layer is also doped which can be accomplished either in-situ or by ion implantation using arsenic (As) or phosphorous (P). The preferred concentration is between about $1\times10^{19}$ to $1\times10^{20}$ $cm^{-3}$.

Figure 2B:
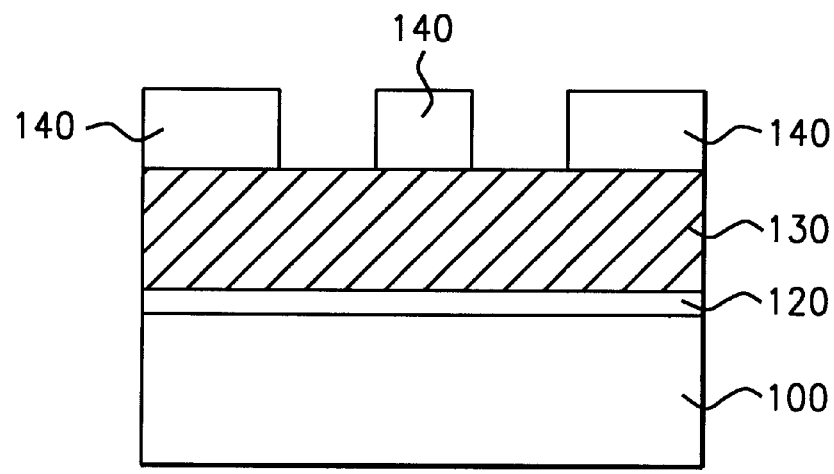
FIG. 2b is a partial cross-sectional view of a semiconductor substrate showing the forming of a nitride layer and patterning of the same on the substrate of FIG. 2a, according to the present invention.
Figure 2C:
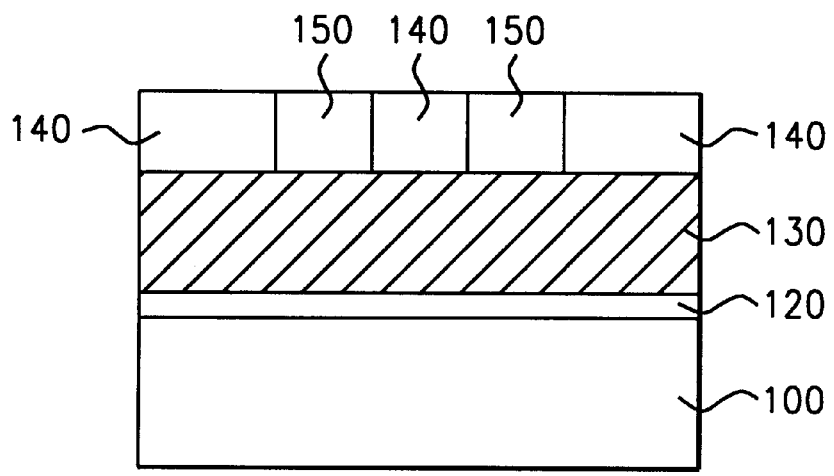
FIG. 2c is a partial cross-sectional view of a semiconductor substrate showing the forming of an oxide layer on the substrate of FIG. 2b, according to the present invention.
Figure 2D:
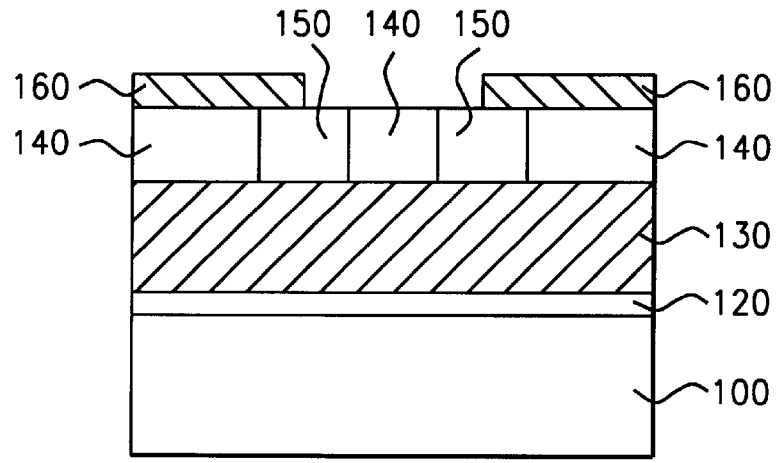
FIG. 2d is a partial cross-sectional view of a semiconductor substrate showing the forming of a thin polysilicon layer and the patterning thereof on the substrate of FIG. 2c, according to the present invention.

Next, nitride layer (140) is formed over the substrate and patterned as shown in FIG. 2b. The patterning is accomplished by forming a photoresist layer (not shown) which in turn used as a mask having patterns of floating gate regions that are to be formed. The patterns are etched into the nitride layer using a recipe comprising gases $CF_4$, $CHF_3$ and Ar. Nitride layer (140) is preferably formed by reacting dichlorosilane ($SiCl_2H_2$), or silane ($SiH_4$), with ammonia ($NH_3$) in an LPCVD. The preferred thickness of the nitride layer is between about 2000 to 3000 Å. Oxide layer (150) is next formed over the substrate filling the patterns previously formed in nitride layer (140) and then subjected to chemical-mechanical polishing (CMP) as shown in FIG. 2c. An LPCVD oxide with a thickness between about 3000 to 4000 Å is preferred.

As an important feature of the present invention, a thin polysilicon layer (160) is formed over the substrate through an LPCVD method employing silane $SiH_4$ as a silicon source material at a temperature range between about 600 to 650° C. Thin layer (160) has a thickness between about 500 to 800 Å, and is patterned with a photoresist mask (not shown) to expose filled nitride regions shown in FIG. 2d.

Figure 2E:
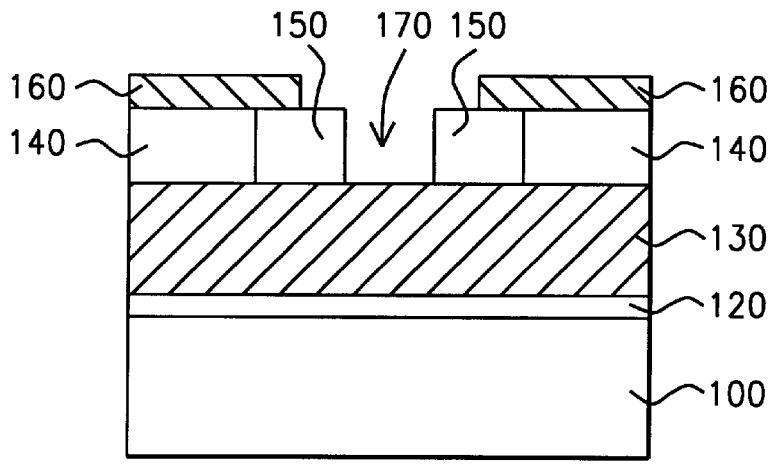
FIG. 2e is a partial cross-sectional view of a semiconductor substrate showing the etching of the nitride portion on the substrate of FIG. 2d, according to the present invention.

Then, the exposed nitride region (150) shown in FIG. 2e is removed to form opening (170) using a recipe comprising phosphoric solution $H_3PO_4$ with a high selectivity for the adjacent oxide region (140).

Figure 2F:
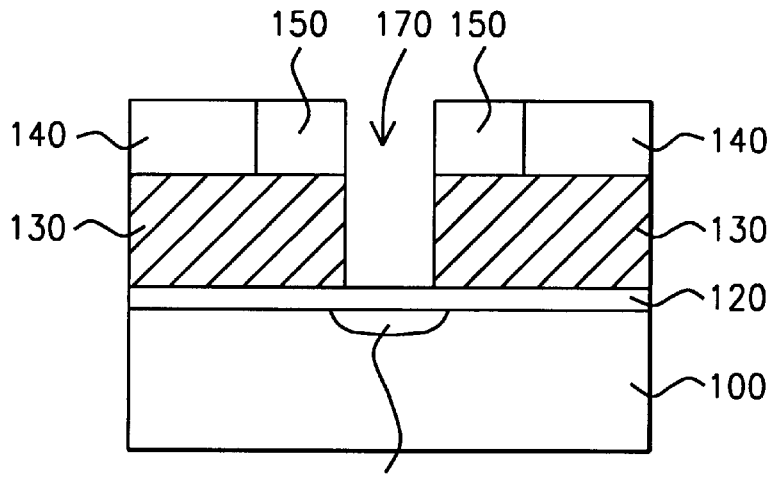
FIG. 2f is a partial cross-sectional view of a semiconductor substrate showing the forming of an opening in the doped polysilicon layer on the substrate of FIG. 2e and the source implantation, according to the present invention.

As another important aspect of the instant invention, the thin polysilicon layer as well as the first polysilicon layer exposed at the bottom of opening (170) are etched with a recipe comprising gases $HBr/Cl_2/O_2$. Subsequently, a source implantation is performed with phosphorous ions at a dosage level between about $2\times10^{15}$ to $8\times10^{15}$ atoms/cm$^2$ and energy between about 30 to 60 KEV to form source region (110) in substrate (100) as shown in FIG. 2f.

Figure 2G:
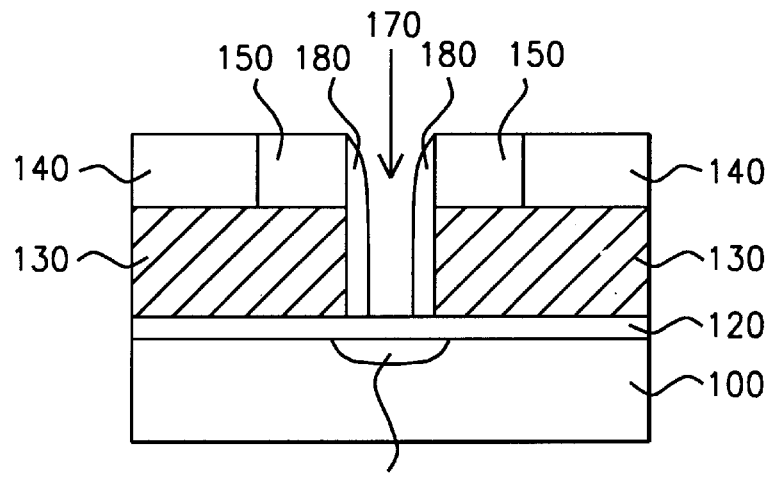
FIG. 2g is a partial cross-sectional view of a semiconductor substrate showing the forming of a spacer in the opening of FIG. 2f, according to the present invention.

Next, spacer (180) is formed on the sidewalls of hole (170) as shown in FIG. 2g. Oxide spacers, as is known in the art, can be formed by depositing TEOS films on the substrate and then etching anisotropically, or by forming composite oxide-nitride-oxide (ONO) following conventional methods. It is preferred that TEOS film with a thickness between about 500 to 1000 Å is formed through the decomposition of tetraethyl orthosilicate at a temperature between about 650 to 750° C. Plasma Enhanced PECVD TEOS films can also be deposited at lower temperatures.

Figure 2H:
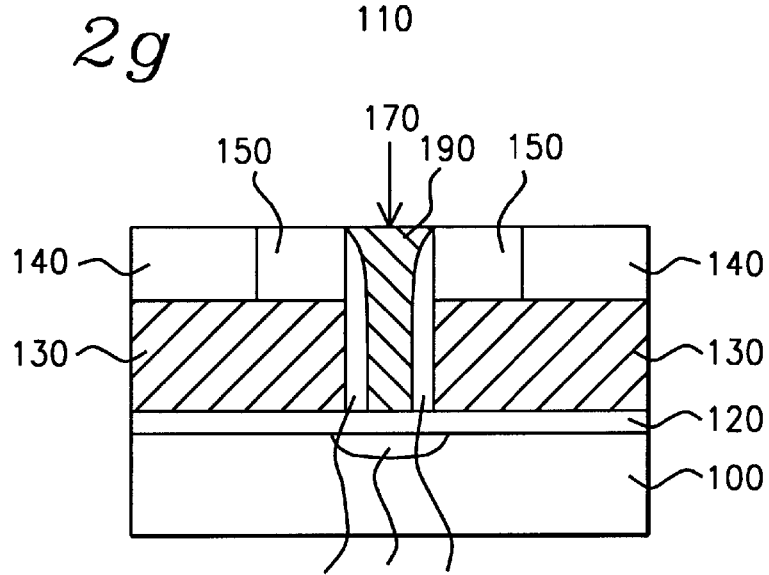
FIG. 2h is a partial cross-sectional view of a semiconductor substrate showing the forming of the self-aligned poly source line of the present invention.

As a main feature and key aspect of the present invention, opening (170) is next filled with a third polysilicon layer to form the self-aligned source line, reference numeral (190) in FIG. 2h, over source region (110) of the transistor device of this invention. The polysilicon is formed employing silane $SiH_4$ as a silicon source material at a temperature range between about 600 to 650° C., and doped with phosphorous at a concentration between about $1\times10^{19}$ to $1\times10^{20}$ atoms/cm$^{-3}$. Preferred thickness of the layer is between about 4000 to 5000 Å, and any excess is removed preferably by CMP.

Figure 2I:
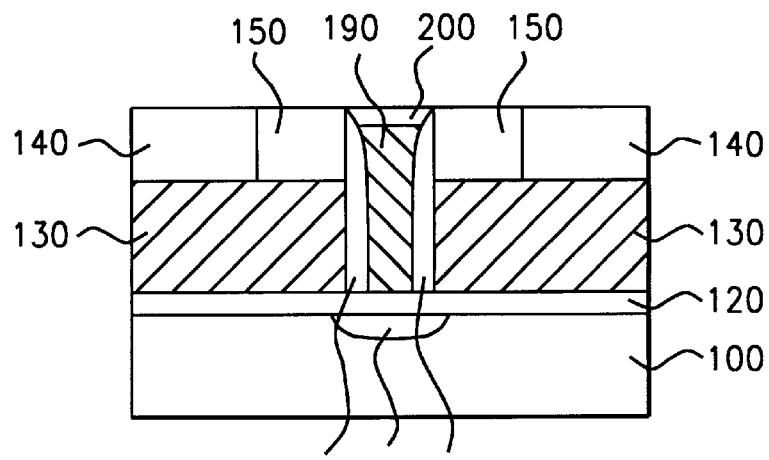
FIG. 2i is a partial cross-sectional view of a semiconductor substrate showing the forming of a protective poly-oxide layer over the source line of FIG. 2h, according to the present invention.
Figure 2J:
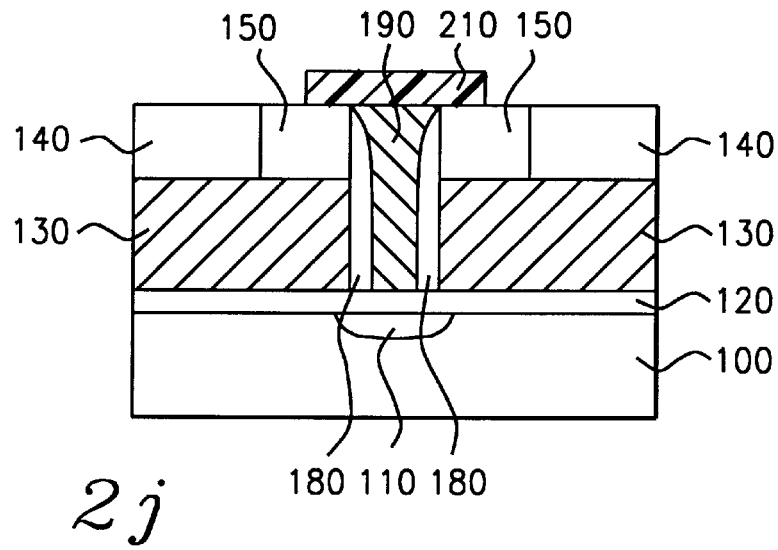
FIG. 2j is a partial cross-sectional view of a semiconductor substrate showing the forming of a protective photoresist mask over the poly source line of FIG. 2i, according to the present invention.
Figure 2K:
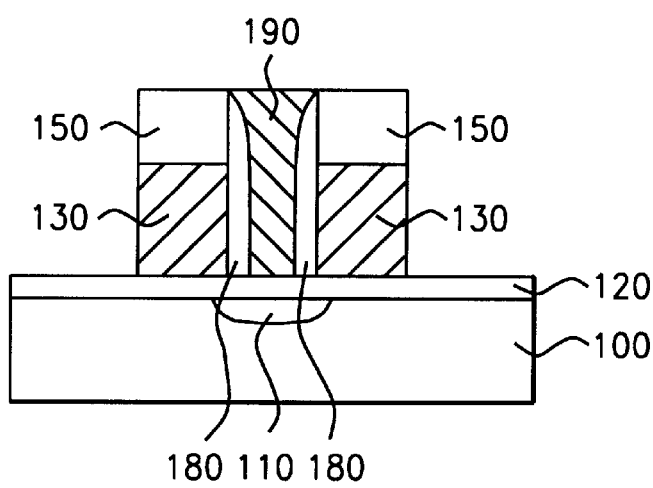
FIG. 2k is a partial cross-sectional view of a semiconductor substrate showing the etching of the nitride layer and the underlying doped polysilicon layer to form the outside walls of the oxide layer and the poly layer, according to the present invention.

The disclosed method of the present invention also makes it possible to self-align the drain contacts of the device in the following way: the nitride portions (140) of the structure shown in FIG. 2i are removed revealing the walls of oxide portions (150), followed by the etching of the doped polysilicon layer forming a vertical wall spanning the polysilicon and the oxide walls as shown in FIG. 2k. Then, drains (130) are formed by ion implanting, and the required contacts formed over the drain regions by using conventional methods for spacers and metal deposition (not shown).

Before etching nitride portions (140), poly source line (190) is first protected. In the preferred embodiment, this is accomplished by oxidizing third polysilicon layer (190) by wet oxidation at a temperature between about 850 to 1100° C. The poly-oxide so formed preferably has a thickness between about 100 to 200 Å, and along with the surrounding oxide layer (150) shown in FIG. 2i serves as a hard mask for etching the doped polysilicon layer at the next step. Alternatively, and as a second embodiment shown in FIG. 2j, a photoresist mask (210) is formed over the poly source line as a protection. Then, with either protection method for the source line, nitride portions (140) are removed by employing wet etch solution. Subsequently, doped first polysilicon layer (130) is etched with a recipe comprising gases HBr, $CL_2$, He and $O_2$. Thus, a vertical wall spanning from the gate oxide layer (120) to the outside walls of the doped poly and oxide portions (150) is formed as shown in FIG. 2k.

Figure 2L:
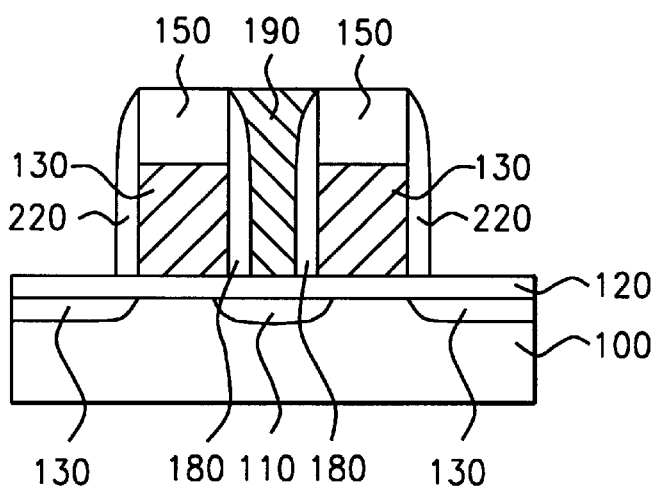
FIG. 2l is a partial cross-sectional view of a semiconductor substrate showing the forming of a spacer along the outside walls of FIG. 2k, whereby self-aligned contact may be formed along with the self-aligned source line, according to the present invention.

As a penultimate step, spacer (220) is formed on the outside walls of doped polysilicon (130) and oxide (150) as shown in FIG. 2l. Spacer (220) can be formed by depositing TEOS films on the substrate and then etching anisotropically, or by forming composite oxide-nitride-oxide (ONO) following conventional methods. It is preferred that TEOS film with a thickness between about 2000 to 3000 Å is formed through the decomposition of tetraethyl orthosilicate at a temperature between about 650 to 750° C. Drain regions (130) in substrate (100) are next formed by implanting arsenic, As, ions at a dosage level between about $2\times10^{15}$ to $5\times10^{15}$ atoms/cm$^2$ and energy level between about 40 to 60 KeV. The device of the invention is completed by forming contacts (not shown) over the drain regions employing conventional methods of depositing an interlevel dielectric layer and then etching the same to form openings for the contacts.

Though the numerous details of the disclosed method are set forth here, such as process steps, to provide an understanding of the present invention, it will be obvious, however, to those skilled in the art that these specific details need not be employed to practice the present invention. A particular set of process steps were given for the preferred embodiments of the present invention. It will be apparent to those skilled in the art that other embodiments can also be constructed by different combinations of the process steps, such as for example, using a combination of CMP and etch-back for the planarization of the polysilicon layers. At the same time, it will be evident that the same methods may be employed in other similar process steps that are too many to cite, such as for forming spacers comprising TEOS or ONO.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a self-aligned source line in a memory cell comprising the steps of:

providing a semiconductor substrate;

forming active and passive regions in said substrate;

forming a gate oxide layer over said substrate;

forming a first doped polysilicon layer over said gate oxide layer;

forming a nitride layer over said first polysilicon layer;

forming a first photoresist mask having a floating gate pattern over said gate oxide layer;

etching said nitride layer through said floating gate pattern in said photoresist mask;

removing said first photoresist mask;

forming an oxide layer over said substrate;

planarizing said oxide layer;

forming a second polysilicon layer over said substrate;

patterning said second polysilicon layer to define a self-aligned source region;

wet etching said nitride layer underlying said second polysilicon layer through said patterning in said second polysilicon layer;

forming an opening in said first polysilicon layer using said oxide layer and remaining said nitride layer as a hard mask;

performing source implantation through said opening in said first polysilicon layer;

forming a spacer in said opening in said first polysilicon layer;

forming a third polysilicon layer in said opening in said first polysilicon layer;

planarizing said third polysilicon layer;

forming a poly-oxide layer over said third polysilicon layer in said opening in said first polysilicon layer;

removing said nitride layer to expose an oxide wall of adjacent said oxide layer by using said oxide layer and remaining nitride layer as a hard mask;

etching said first polysilicon layer to expose a polysilicon wall underlying said oxide wall;

forming a spacer along said oxide wall and said polysilicon wall;

performing drain implantation in said substrate; and forming contacts for said drain regions of said memory cell.

2. The method of claim 1, wherein said semiconductor substrate is silicon.

3. The method of claim 1, wherein said forming active and passive regions is accomplished by using LOCOS process.

4. The method of claim 1, wherein said forming a gate oxide layer is accomplished by thermal growth at a temperature between about 850 to 1100° C.

5. The method of claim 1, wherein said gate oxide has a thickness between about 50 to 100 Å.

6. The method of claim 1, wherein said forming said first polysilicon layer is accomplished by an LPCVD method employing silane $SiH_4$ as a silicon source material at a temperature range between about 500 to 650° C.

7. The method of claim 1, wherein said first polysilicon layer has a thickness between about 1000 to 2000 Å.

8. The method of claim 1, wherein said first polysilicon layer is doped in-situ or by ion implantation using arsenic (As) or phosphorous (P).

9. The method of claim 1, wherein said forming nitride layer is accomplished by reacting dichlorosilane ($SiCl_2H_2$) with ammonia ($NH_3$) in an LPCVD at a temperature between about 750 to 850° C.

10. The method of claim 1, wherein said nitride layer has a thickness between about 2000 to 3000 Å.

11. The method of claim 1, wherein said etching into said nitride layer is accomplished with a recipe comprising gases $CF_4$, $CHF_3$ and Ar.

12. The method of claim 1, wherein said forming said oxide layer is accomplished by LPCVD.

13. The method of claim 1, wherein said oxide layer has a thickness between about 3000 to 4000 Å.

14. The method of claim 1, wherein said planarizing said oxide layer is accomplished by chemical-mechanical polishing (CMP).

15. The method of claim 1, wherein said forming said second polysilicon layer is accomplished by an LPCVD method employing silane $SiH_4$ as a silicon source material at a temperature range between about 500 to 650° C.

16. The method of claim 1, wherein said second polysilicon layer has a thickness between about 500 to 800 Å.

17. The method of claim 1, wherein said wet etching said nitride layer is accomplished with a solution comprising $H_3PO_4$.

18. The method of claim 1, wherein said forming an opening in said first polysilicon layer is accomplished with a gases $HBr/Cl_2/O_2$.

19. The method of claim 1, wherein said source implantation is accomplished with phosphorous at a dosage between about $2\times10^{15}$ to $8\times10^{15}$ atoms/cm$^2$ and energy level between about 30 to 60 KEV.

20. The method of claim 1, wherein said forming a spacer is accomplished by depositing TEOS and etching anisotropically.

21. The method of claim 1, wherein said forming a third polysilicon layer is accomplished by an LPCVD method employing silane $SiH_4$ as a silicon source material at a temperature range between about 500 to 650° C.

22. The method of claim 1, wherein said third polysilicon layer has a thickness between about 4000 to 5000 Å.

23. The method of claim 1, wherein said planarizing said third polysilicon layer is accomplished by performing chemical-mechanical polishing.

24. The method of claim 1, wherein said forming said poly-oxide is accomplished by oxidizing said third polysilicon layer by wet oxidation at a temperature between about 850 to 1100° C.

25. The method of claim 1, wherein said poly-oxide layer has a thickness between about 100 to 200 Å.

26. The method of claim 1, wherein said removing said nitride layer to expose a wall of adjacent said oxide layer is accomplished with a wet etch recipe comprising $H_3PO_4$.

27. The method of claim 1, wherein said etching said first polysilicon layer to form said polysilicon wall is accomplished with a recipe comprising gases HBr, $CL_2$, He and $O_2$.

28. The method of claim 1, wherein said forming said spacer along said oxide wall and said polysilicon wall is accomplished by depositing TEOS and etching anisotropically.

29. The method of claim 1, wherein said performing said drain implantation is accomplished with As ions at a dosage level between about $2\times10^{15}$ to $5\times10^{15}$ atoms/cm$^2$ and energy level between about 40 to 60 KeV.

30. A method of forming a self-aligned source line in a memory cell comprising the steps of:

providing a semiconductor substrate;

forming active and passive regions in said substrate;

forming a gate oxide layer over said substrate;

forming a first doped polysilicon layer over said gate oxide layer;

forming a nitride layer over said first polysilicon layer;

forming a first photoresist mask having a floating gate pattern over said gate oxide layer;

etching said nitride layer through said floating gate pattern in said photoresist mask;

removing said first photoresist mask;

forming an oxide layer over said substrate;

planarizing said oxide layer;

forming a second polysilicon layer over said substrate;

patterning said second polysilicon layer to define a self-aligned source region;

wet etching said nitride layer underlying said second polysilicon layer through said pattern in second polysilicon layer;

forming an opening in said first polysilicon layer using said oxide layer and remaining nitride layer as a hard mask;

performing source implantation through said opening in said first polysilicon layer;

forming a spacer in said opening in said first polysilicon layer;

forming a third polysilicon layer in said opening in said first polysilicon layer;

planarizing said third polysilicon layer;

forming a second photoresist mask over said third polysilicon layer in said first polysilicon layer;

removing said nitride layer to expose said oxide wall of adjacent said oxide layer while protecting said third polysilicon layer with said second photoresist mask;

etching said first polysilicon layer to form a polysilicon wall underlying said oxide wall;

removing said second photoresist mask;

forming spacer along said oxide wall and said polysilicon wall;

performing drain implantation in said substrate; and forming contacts for said drain regions of said memory cell.

31. The method of claim 30, wherein said semiconductor substrate is silicon.

32. The method of claim 30, wherein said forming active and passive regions is accomplished by using LOCOS process.

33. The method of claim 30, wherein said forming a gate oxide layer is accomplished by thermal growth at a temperature between about 850 to 1100° C.

34. The method of claim 30, wherein said gate oxide has a thickness between about 50 to 100 Å.

35. The method of claim 30, wherein said forming said first polysilicon layer is accomplished by an LPCVD method employing silane $SiH_4$ as a silicon source material at a temperature range between about 500 to 650° C.

36. The method of claim 30, wherein said first polysilicon layer has a thickness between about 1000 to 2000 Å.

37. The method of claim 30, wherein said first polysilicon layer is doped in-situ or by ion implantation using arsenic (As) or phosphorous (P).

38. The method of claim 30, wherein said forming nitride layer is accomplished by reacting dichlorosilane ($SiCl_2H_2$) with ammonia ($NH_3$) in an LPCVD at a temperature between about 750 to 850° C.

39. The method of claim 30, wherein said nitride layer has a thickness between about 2000 to 3000 Å.

40. The method of claim 30, wherein said etching into said nitride layer is accomplished with a recipe comprising gases $CF_4$, $CHF_3$ and Ar.

41. The method of claim 30, wherein said forming said oxide layer is accomplished by LPCVD.

42. The method of claim 30, wherein said oxide layer has a thickness between about 3000 to 4000 Å.

43. The method of claim 30, wherein said planarizing said oxide layer is accomplished by CMP.

44. The method of claim 30, wherein said forming said second polysilicon layer is accomplished by an LPCVD method employing silane $SiH_4$ as a silicon source material at a temperature range between about 500 to 650° C.

45. The method of claim 30, wherein said second polysilicon layer has a thickness between about 500 to 800 Å.

46. The method of claim 30, wherein said wet etching said nitride layer is accomplished with a solution comprising $H_3PO_4$.

47. The method of claim 30, wherein said forming an opening in said first polysilicon layer is accomplished with a gases $HBr/Cl_2/O_2$.

48. The method of claim 30, wherein said source implantation is accomplished with phosphorous at a dosage between about $2\times10^{15}$ to $8\times10^{15}$ atoms/cm$^2$ and energy level between about 30 to 60 KEV.

49. The method of claim 30, wherein said forming said spacer is accomplished by forming composite oxide-nitride-oxide (ONO) layer and etching anisotropically.

50. The method of claim 30, wherein said forming a third polysilicon layer is accomplished by an LPCVD method employing silane $SiH_4$ as a silicon source material at a temperature range between about 500 to 650° C.

51. The method of claim 30, wherein said third polysilicon layer has a thickness between about 4000 to 5000 Å.

52. The method of claim 31, wherein said planarizing said third polysilicon layer is accomplished by CMP.

53. The method of claim 30, wherein said removing said nitride layer to expose sidewall of adjacent said oxide layer is accomplished with a wet etch recipe comprising $H_3PO_4$.

54. The method of claim 30, wherein said etching said first polysilicon layer to form said polysilicon wall is accomplished with a recipe comprising gases HBr, $CL_2$, He and $O_2$.

55. The method of claim 30, wherein said forming said spacer along said oxide wall and said polysilicon wall is accomplished by forming an ONO layer and etching anisotropically.

56. The method of claim 30, wherein said performing said drain implantation is accomplished with As ions at a dosage level between about $2\times10^{15}$ to $5\times10^{15}$ atoms/cm$^2$ and energy level between about 40 to 60 KeV.

* * * * *